United States Patent
Budach et al.

(10) Patent No.: US 9,336,983 B2
(45) Date of Patent: May 10, 2016

(54) SCANNING PARTICLE MICROSCOPE AND METHOD FOR DETERMINING A POSITION CHANGE OF A PARTICLE BEAM OF THE SCANNING PARTICLE MICROSCOPE

(71) Applicant: Carl Zeiss SMT GmbH, Oberkochen (DE)

(72) Inventors: Michael Budach, Hanau (DE); Christof Baur, Darmstadt (DE); Dajana Cujas, Seeheim-Jugenheim (DE); Robert Heberlein, Hemsbach (DE); Marion Batz, Wiesbaden (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 14/755,264

(22) Filed: Jun. 30, 2015

(65) Prior Publication Data
US 2015/0380210 A1     Dec. 31, 2015

(30) Foreign Application Priority Data
Jun. 30, 2014   (DE) .......................... 10 2014 212 563

(51) Int. Cl.
| | | |
|---|---|---|
| H01J 37/00 | (2006.01) | |
| H01J 37/26 | (2006.01) | |
| H01J 37/28 | (2006.01) | |

(52) U.S. Cl.
CPC ............... *H01J 37/265* (2013.01); *H01J 37/28* (2013.01)

(58) Field of Classification Search
CPC ................................ H01J 37/265; H01J 37/28
USPC .................................. 250/306, 307, 310, 311
See application file for complete search history.

(56) References Cited

U.S. PATENT DOCUMENTS

| | | | | |
|---|---|---|---|---|
| 2010/0230584 A1* | 9/2010 | Niebel | ................... | H01J 37/153 250/252.1 |
| 2013/0284924 A1* | 10/2013 | Mizuochi | ........... | G01N 23/2206 250/310 |

FOREIGN PATENT DOCUMENTS

| | | | | |
|---|---|---|---|---|
| DE | 691 23 612 | 6/1997 | ............. | H01J 37/28 |
| DE | 10 2009 001 587 | 7/2010 | ............. | H01J 37/20 |
| EP | 0 442 630 | 8/1991 | ............. | H01J 37/28 |
| EP | 2 416 165 | 2/2012 | ............. | G01Q 30/02 |
| JP | 2009-148889 | 7/2009 | ................ | B82B 3/00 |
| WO | WO 2012/163518 | 12/2012 | ............. | H01J 37/28 |

OTHER PUBLICATIONS

Emundts et al., "Combination of a Besocke-type scanning tunneling microscope with a scanning electron microscope", *Review of Scientific Instruments*, vol. 72, No. 9, pp. 3546-3551 (Sep. 2001).
Gerber et al., "Scanning tunneling microscope combined with a scanning electron microscope", *Review of Scientific Instruments*, vol. 57, No. 2, pp. 221-224 (Feb. 1986).
Wiessner et al., "Design considerations and performance of a combined scanning tunneling and scanning electron microscope", *Rev. Sci. Instrum.*, vol. 68, No. 10, pp. 3790-3798 (Oct. 1997).
"Transparently combining SEM, TEM & FIBs with AFM / SPM & NSOM" in product brochure of Nanonics Imaging Ltd., Issue 2.3, Dec. 2002 (4 pages).
German Office Action for German Application No. 10 2014 212 563.4 dated Apr. 15, 2015 (10 pages).

* cited by examiner

*Primary Examiner* — Michael Maskell
(74) *Attorney, Agent, or Firm* — Fish & Richardson P.C.

(57) ABSTRACT

The invention refers to a scanning particle microscope comprising: (a) at least one reference object which is fixedly arranged at an output of the scanning particle microscope for a particle beam so that the reference object can at least partially be imaged by use of the electron beam; (b) at least one scanning unit operable to scan a particle beam of the scanning particle microscope across at least one portion of the reference object; and (c) at least one setting unit operable to change at least one setting of the scanning particle microscope.

20 Claims, 12 Drawing Sheets

SCANNING PARTICLE MICROSCOPE AND METHOD FOR DETERMINING A POSITION CHANGE OF A PARTICLE BEAM OF THE SCANNING PARTICLE MICROSCOPE

CROSS-REFERENCE TO RELATED APPLICATION

Under 35 U.S.C. §119, this application claims priority to German Patent Application 10 2014 212 563.4, filed on Jun. 30, 2014, whose disclosure content is hereby incorporated by reference in its entirety.

TECHNICAL FIELD

The present invention refers to a scanning particle microscope and a method for determining a position change of a particle beam of the scanning particle microscope.

BACKGROUND

Progress in the field of nano-technology enables the fabrication of devices having smaller and smaller structural elements. For the processing and the representation of nano-structures, tools are required which are able to scan these structures in several dimensions so that an image can be generated from the measurement data.

In a scanning particle microscope, a particle beam interacts with a sample. Scanning particle microscopes are in the following abbreviated as SBM (Scanning particle Beam Microscope). For example, electrons and/or ions are used as particles. Other particle beams can also be used, such as, for example, atom beams or molecule beams. Using electron beams or ion beams, large areas of a sample can be scanned with an adjustable resolution. Thus, scanning particle microscopes are powerful analysis tools in the nano-technology.

These tools can provide limited topographical information of the sample surface in the direction of the particle beams. In many application fields of the nano-technology, it is useful to precisely know the height profiles of a sample surface.

On the other hand, scanning probe microscopes scan a sample or its surface with a test prod, and thus generate a realistic topography of the sample surface. In the following, a scanning probe microscope is abbreviated by SPM (for Scanning Probe Microscope). Various types of SPMs are differentiated by the kind of interaction between the test prod and the sample surface, as for example scanning tunneling microscopes (STM) and scanning force microscope (AFM for Atomic Force Microscope or SFM for Scanning Force Microscope).

Scanning probe microscopes can scan the sample surface with a resolution up to the atomic range depending on the used test prod. However, the large resolution limits the application of these tools to very small sections of a sample.

Already some time ago, these considerations have led to the idea to use both tools for the analysis of a sample. For example, the authors Ch. Gerber et al. describe in the article "Scanning tunneling microscope combined with a scanning electron microscope", Rev. Sci. Instr., Vol. 357, No. 2, pp. 221-224 (1986) to combine scanning particle microscopes and scanning probe microscopes in one apparatus. In a simultaneous operation, these tools shall simultaneously investigate one position of a sample in order to bring into effect the benefits of the respective tool and to avoid to a large extent the discussed drawbacks of each tool.

The development has been started from both sides. For example, the authors A. Emundts et al. describe in the article "Combination of a Besocke-type scanning tunneling microscope with a scanning electron microscope", Ref. Sci. Instr., Vol. 72, No. 9, pp. 3546-3551 (2001), the insertion of an electron gun and a respective detector in a scanning tunneling microscope. The authors A. Wiesner et al. exemplarily explain the subsequent insertion of a scanning tunneling microscope in a scanning electron microscope in the article "Design consideration and performance of a combined scanning tunneling and scanning electron microscope", Ref. Sci. Instr., Vol. 68, No. 10, pp. 3090-3098 (1997).

The Japanese application JP 2009 148 889 A discloses a combination of a focused ion beam (FIB) device and a force microscope. The sample stage of the combined tool has a tilting device which allows aligning of the sample in the direction of both analysis systems.

When combining a scanning particle microscope and a scanning probe microscope, several partially fundamental problems appear. A space problem inevitably occurs when combining both analysis tools in one vacuum chamber. Therefore, due to construction problems often a trade-off is made with respect to the performance of both tools. For example, the number of detectors is limited which can be used for analyzing particles released by the particle beam of the scanning particle microscope from the sample.

Another important issue is the mutual interaction of the two analysis tools when they are simultaneously in operation. For example, the tip or the test prod of the probe can partially shadow the particle beam, and thus restrict its field of view. The article "Transparently combining SEM, TEM & FIBs with AFM/SPM & NSOM" in the product brochure Nanonics, Issue 2.3, December 2002, describes the application of specifically developed glass probes for the scanning probe microscope in order to reduce the shadowing effect with respect to the particle beam. The described disadvantages can be avoided to a large extent by dropping the requirement that the SBM and the SPM simultaneously investigate the sample at the same position. Such a combination of the two analysis tools is described in the PCT application WO 2012/163 518 of the applicant. As a result, the trade-offs in the performance enforced by space problems of a SBM and a SPM and their combination in an apparatus can be avoided.

If the two tools investigate the sample spatially separated from each other, the distance of the positions at which the respective analysis tool scans the probe have to be exactly known. Already the change of one or several parameters of the SBM however leads to a small change of the point of impact of the particle beam on the sample surface.

As a consequence, a re-calibration of the SBM, i.e. a change of one or several parameters of the SBM, requires a re-determination of the distance between the SBM and the SPM. Such a measurement process is time consuming. It requires either inserting a measuring stick into the apparatus or shifting one of the two analysis tools into the operating range of the other one, if this is possible. Both alternatives reduce the sample through-put.

SUMMARY

The present invention is therefore based on the problem to provide a scanning particle microscope and a method for determining a position change of a particle beam of the scanning particle microscope due to a setting change of the scanning particle microscope which at least partially avoid the above mentioned drawbacks.

According to an embodiment of the present invention this problem is solved by a scanning particle microscope that includes: (a) at least one reference object which is fixedly arranged at the output of the scanning particle microscope for a particle beam so that the reference object can at least partially be imaged by the particle beam; (b) at least one scanning unit operable to scan the particle beam of the scanning particle microscope across at least a portion of the reference object; and (c) at least one setting unit operable to change at least one setting of the scanning particle microscope.

By scanning the particle beam across a portion of the reference object the scanning unit generates an image field or a FOV (Field Of View) of the scanning particle microscope. The image field can be represented on a display of the scanning particle microscope. A change of the setting of the scanning particle microscope leads to a shift of the scan region of the particle beam, and thus to a change of the image field of the scanning particle microscope.

On the other hand, the position of the reference object which is fixedly connected with the output of the particle beam of a scanning probe microscope is essentially not affected by a setting change of the scanning probe microscope. Thus, a scanning particle microscope having a reference object has an entity which can be used to detect a shift of the image field relative to the reference object caused by a setting change. Thus the change of the point of impact of the particle beam onto a sample can be detected. As a result, an inventive scanning particle microscope avoids a time consuming re-determination of the distance between the point of impact of the particle beam onto a sample and the operating point, for example of a scanning probe microscope after each change of the setting of the scanning particle microscope. The expression "essentially" means here as well as in other passages of the description a designation within the usual measurement errors at the determination of the respective quantity.

In a further aspect, the at least one scanning unit is further operable to scan the particle beam of the scanning particle microscope across at least a portion of the reference object before and after the at least one setting change of the scanning particle microscope by use of the setting unit. The scanning particle microscope further comprises an evaluation unit which is operable to detect from data measured during the scanning a position of the point of impact of the particle beam on the sample surface relative to the reference object before and after the setting change.

The evaluation unit can be part of the scanning particle microscope or can be a separate unit. By measuring the position of the reference object within the field of view of the scanning particle microscope before changing the setting and after performing a setting change, a shift of the beam axis of the scanning particle microscope relative to the reference object can be determined. Thereby, it is assumed that the reference object is not changed with respect to the sample surface when changing a setting. Rather, a setting change results in a relative shift of the field of view of the scanning particle microscope with respect to the reference object as well as the sample surface.

According to another aspect, the reference object comprises a lattice-like structure and/or a pointer structure.

A lattice-like structure enables to display both a part of the reference object and a part of the sample surface within the FOV or the image field or the measurement field of the scanning particle microscope, and thus to easily change between the operating modes of scanning the sample surface on the one hand, and scanning the reference object on the other hand.

A pointer structure or a locator structure has the advantage that a reference position can be defined by one or several locators which can be interpreted, for example independent from the magnification of the scanning particle microscope. It is a further benefit of a locator structure that one or several locators of the reference object only require a low area portion in the field of view of the scanning particle microscope. As a consequence, a locator structure does not significantly influence the scanning of the sample surface.

In still a further aspect, the lattice-like structure of the reference object has openings with a width $\leq 100$ µm, preferably $\leq 50$ µm, more preferred $\leq 30$ µm, and most preferred $\leq 10$ µm. According to another aspect, the lattice-like structure and/or the locator structure of the reference object has outer dimensions of $\geq 0.1$ mm, preferably $\geq 0.3$ mm, more preferred $\geq 1.0$ mm, and most preferred $\geq 5.0$ mm. According to still a further aspect, a lattice bar of the lattice-like structure and/or a locator of the locator structure of the reference object have a width of $\leq 5$ µm, preferably $\leq 2$ µm, more preferred $\leq 1$ µm, and most preferred $\leq 0.5$ µm. In a beneficial aspect, a distance of the lattice-like structure and/or the locator structure of the reference object from the sample surface comprises $\leq 250$ µm, preferably $\leq 100$ µm, more preferred $\leq 50$ µm, and most preferred $\leq 10$ µm.

According to a further preferred aspect, the locator structure comprises at least one locator having the form of a spear head. According to another aspect, the locator structure comprises at least two locators which are arranged so that the spear heads show to the center of a circle and the center of the circle is within the scanning region of the scanning unit. In a further beneficial aspect, the at least two locators have an angle of 90°.

According to a beneficial aspect, the lattice-light structure is electrically conducting for compensating surface charges on the sample surface. In an advantageous aspect, the reference object is arranged at the scanning particle microscope in an electrically isolated way. In still another preferred aspect, the reference object comprises an amplifier, in particular a trans-impedance amplifier which is arranged spatially separated from the reference object, and the amplifier is connected with the reference object in an electrically conductive way.

An additional image channel is detected, when apart from the detection of the particles generated by the particle beam, the current which generated by the reference object when scanning the particle beam over the lattice-like structure is additionally measured. The measurement of the current generated by the particle beam in the lattice-like structure provides an important signal for distinguishing whether the particle beam currently scans across a portion of the reference object or across a portion of the sample surface.

According to still a further aspect, the reference object has marks by which measured data obtained during scanning can be assigned to a subarea of the reference object.

Typically, the resolution of a scanning particle microscope can vary across a larger range. This is linked with a variation of the portion of the reference object which can be displayed within the FOV. It is therefore beneficial if the lattice-like structure of the reference object has marks forming a scale of the lattice-like structure which provide a coordinate system so that the individual periods can uniquely be identified despite the periodicity of the lattice-like structure.

In an advantageous aspect, the setting unit sets the scanning particle microscope so that the particle beam simultaneously displays at least one portion of the reference object and at least one portion of the sample surface.

The present application exploits the fact that the point of impact of the particle beam of a scanning particle microscope on a sample surface changes in the same way as the shift of the reference object within the scanning region of the particle beam, and thus in the image field of the scanning particle microscope.

According to an aspect, the setting of the scanning particle microscope comprises: setting a magnification, setting a focus, setting a stigmator, setting an acceleration voltage, setting a beam shift, adjusting a position of a particle source of the scanning particle microscope and/or changing of an aperture diaphragm.

According to the preferred aspect, a measuring apparatus is operable with a scanning particle microscope according to one of the above indicated aspects and with a scanning probe microscope in order to take into account a setting change of the scanning particle microscope at the determination of a distance between the point of impact of the particle beam of the scanning particle microscope on a sample surface and an interaction point of a probe of the scanning probe microscope with the sample surface.

This application example combines a scanning particle microscope and a scanning probe microscope for example in a vacuum chamber. However, the defined measuring apparatus drops the requirement that the SBM (Scanning particle Beam Microscope) and the SPM (Scanning Probe Microscope) simultaneously investigate a sample at the same position. Thereby, the defined measuring apparatus solves the space problem when combining a SBM and a SPM in one apparatus. Thus, a substantially enlarged freedom is obtained when designing the SBM and the SPM. By significantly relaxing the trade-off between space and function of the two analysis tools, the performance of the SBM and the SPM are no longer mutually restricted. The spatial separation of the two analysis tools enables in particular the investigation of samples having a large area, as for example photo masks. Additionally, the powerful spectroscopic operating modes of a scanning particle microscope can be used, as for example EDX (Energy Dispersive X ray spectroscopy) for analyzing the sample surface.

By providing a scanning particle microscope with a fixedly connected reference object, the above specified measuring apparatus enables a simple and reproducible switching between a first measurement point (the point of impact of the particle beam) at which a particle beam locally scans a region of a sample surface to be investigated and a second measurement point at which a test prod of a SPM locally interacts with a region of the sample surface to be investigated.

According to another aspect, the change of the distance between the point of impact and the interaction point is determined from the distance of the point of impact and the interaction point before the setting change of the scanning particle microscope and a vector of the position change of the point of impact due to the setting change of the scanning particle microscope.

This aspect avoids that the distance between the interaction point and the new changed point of impact of the particle beam has completely newly be measured after each setting change of the scanning particle microscope. Rather, the new distance (i.e. changed by the setting change) between the interaction point and the new point of impact of the particle beam is determined from the original distance between the interaction point and the original point of impact (i.e. prior to the setting change of the SBM) and a vector which describes the position change of the point of impact by the setting change.

This problem is solved according to a further execution example of the present invention by a method for determining at least one position change of a particle beam of a scanning particle microscope due to at least one setting change of the scanning particle microscope. The method includes the steps of: (a) at least partially scanning a reference object a first time by the particle beam of the scanning particle microscope by use of a scanning unit, wherein the reference object is fixedly arranged at an output of the scanning particle microscope for a particle beam; (b) changing at least one setting of the scanning particle microscope by use of a setting unit; (c) at least partially scanning the reference object a second time by the particle beam of the scanning particle microscope by use of the scanning unit; and (d) determining the position change of the particle beam of the scanning particle microscope from data of the first and second scanning by use of an evaluation unit.

In a further aspect, the first and the second scanning further comprises: at least partially scanning a sample surface.

According to a further aspect, determining the position change of the particle beam comprises: determining a relative shift of the reference object with respect to a scan region of the scanning unit.

Moreover, another aspect further comprises: measuring an electrical current generated by the reference object during the scanning.

Finally, another preferred aspect further comprises: determining a distance change between the point of impact of the scanning particle microscope on the sample surface and an interaction point of the probe of a scanning probe microscope on the sample surface from a distance of the point of impact and the interaction point before changing at least one setting of the scanning particle microscope and a vector of the change of position of the point of impact due to the setting change of the scanning particle microscope.

BRIEF DESCRIPTION OF DRAWINGS

In the following detailed description presently preferred embodiments of the invention are described with reference to the figures, wherein.

DETAILED DESCRIPTION

In the following presently preferred embodiments of an inventive scanning particle microscope (SBM) and an inventive method are explained in more detail. The inventive method is explained with reference to the example of a combination of a scanning particle microscope (SBM) and a scanning probe microscope (SPM). However, the inventive method for determining a change of a position of a particle beam of the scanning particle microscope is not limited to the example discussed in the following. Rather, the method can be applied to any arbitrary SBM.

Figure 1:
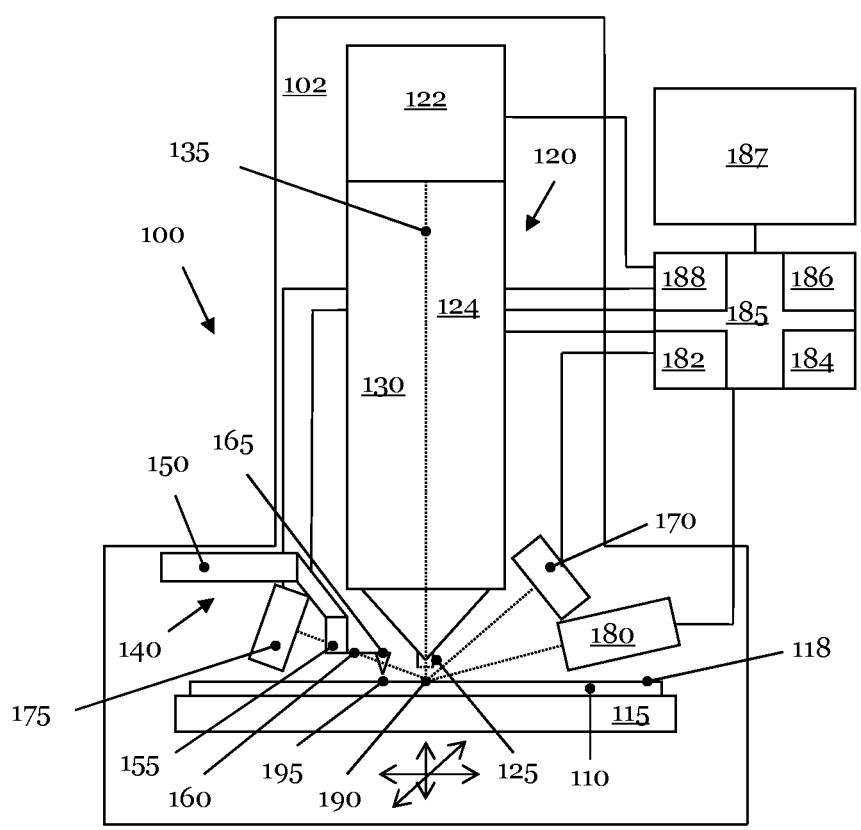
FIG. 1 shows a schematic representation of some important components of a measuring apparatus including a scanning particle microscope and a scanning probe microscope and a first measurement point of the scanning particle microscope and a second measurement point of the scanning probe microscope.

FIG. 1 schematically shows a section of some components of a measuring apparatus 100 which comprises a scanning particle system 120 and a scanning probe system 140 which are arranged in a vacuum chamber 102 next to each other. The scanning particle microscope 120 comprises a particle gun 122 and a column 130 in which the electron optics or the beam optics 124 of the SBM 120 is arranged. The particle gun 122 generates a particle beam 135 and the electron or beam optics 124 focuses the particle beam 135 and directs it to a sample 110 at the output of the column 130.

The sample 110 is arranged on the sample stage 115. As symbolized by arrows in FIG. 1, the sample stage 115 can be moved in three directions relative to the SBM 120 and the SPM 140.

The particle beam 135 impinges at the first measuring point 190 on the sample 110. The sample 110 can be an arbitrary micro-structured component or any device, for example the sample 110 can comprise a transmissive or a reflective photo mask and/or a template for the nano-imprint technique.

In the execution example of the microscope system 100 illustrated in FIG. 1, the SBM 120 comprises a scanning electron microscope (SEM). Using an electron beam as particle beam 135 has the benefit that the electron beam does essentially not damage the sample 110.

Figure 2:
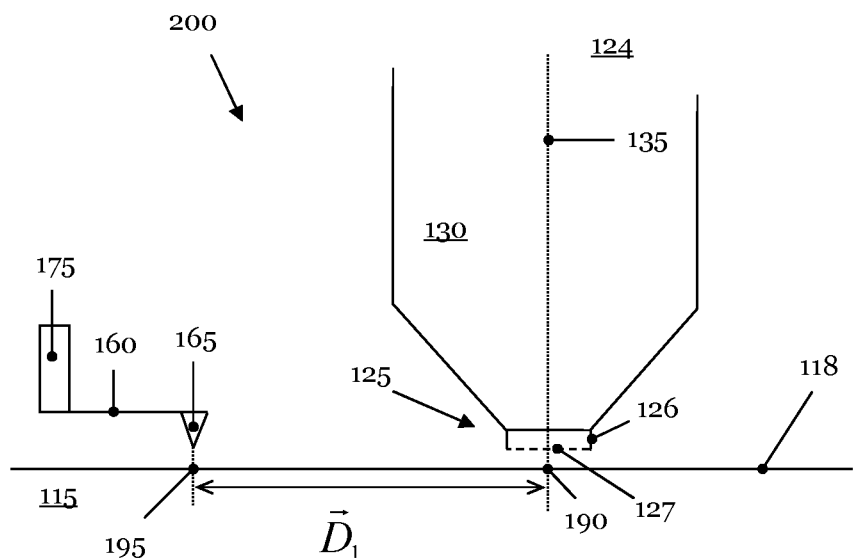
FIG. 2 represents an enlarged section of the measuring apparatus of FIG. 1 around the region of the two measurement points.

At the lower end of the column 130 at which the electron beam 135 exits the electron optics 124 arranged within the column 130, a reference object 125 is fixed to the column 130. The region around the reference object 125 is depicted in FIG. 2 on an enlarged scale. The details of the reference object 125 are explained on the basis of the discussion of FIGS. 2 to 11.

Instead of a scanning electron microscope 120 the measuring apparatus 100 of FIG. 1 can also have an FIB (Focused Ion Beam) device (also not depicted in FIG. 1).

In the example represented in FIG. 1, the scanning probe microscope 140 is an atomic force microscope (AFM). Instead of an AFM, a scanning tunneling microscope (STM) can also be used. Apart from the tunneling current (scanning tunneling microscope) and the van-the-Waals forces (AFM) many further physical quantities can also be used for investigating a sample. For example, a magnetic force microscope uses the magnetic interaction between the sample 110 and the probe or its test prod (not shown in FIG. 1).

The SPM 140 is fixed with the support 150 to the measuring apparatus 100. The upper end of a Piezo actuator 155 of the SPM 140 is connected with the support 150. The opposite end of the Piezo actuator 155 carries the probe of the SPM 140. The probe comprises a lever arm 160 which is in the following called cantilever as it is usual in this field. The cantilever holds on its free end the test prod 165. The probe 165 interacts at the second measuring point 195 with the sample 110.

A detector 170 transforms secondary electrons generated by the electron beam 135 at the first measuring point 190 and/or electron back scattered from the sample 110 into an electrical measuring signal and forwards it to the evaluation unit 186 of the computer system 185. The detector can contain a filter or a filter system in order to discriminate the electrons with respect to energy and/or with respect to the solid angle (not represented in FIG. 1).

The measuring apparatus 110 can further comprise a detector 175 for detecting photons which are generated from the incident electron beam 135 at the first measuring point 190. For example, the detector can spectrally resolve the energy spectrum of the generated photons, and thus enables conclusions on the composition of the surface 118 and layers close to the surface of the sample 110, respectively.

Moreover, the measuring apparatus 110 can comprise an ion source 180 which provides ions of low energy in the region of the first measuring point 190 in case that the sample is electrically isolated, or has an electrically isolating surface layer.

As already mentioned, the computer system 185 comprises a scanning unit 182 which scans the electron beam 135 across the sample 110 and the reference object 125. In some implementations, the scanning unit 182 can be configured to cause the computer system 185 to generate control signals that are transmitted to, e.g., a deflection module (not shown in the figure), such as deflection coils. The control signals cause the deflection module to generate signals that can deflect a particle beam (e.g., electron beam) in a controlled manner. It is also possible that the computer system 185 may transmit the control signals to a control unit that generates voltage signals (for example, a sawtooth-shaped voltage) to drive for example deflection coils in order to deflect a particle beam, and thus scan it across a sample and/or across a reference object.

Furthermore, the computer system 185 comprises a setting unit 184 which sets and controls the various parameters of the SBM 120 and/or the SPM 140. In some implementations, the setting unit 184 can be configured to cause the computer system 185 to generate control commands that are sent to the SBM 120 and/or the SPM 140 for setting the various parameters.

Additionally, the computer system 185 comprises an evaluation unit 186 which analyzes the measuring signals of the detectors 170 and 175 and generates an image which can be indicated on the display 187. The region in which the scanning unit 182 scans the electron beam 135 or the particle beam 135 across the sample 110 and/or across the reference object 125 is represented on the display 187 of the computer system 185, and is thus called the image field or FOV. The evaluation unit 186 also processes the measuring signal of the SPM 140 and graphically represents it on the display 187. For this purpose, the evaluation unit 186 comprises one or several algorithms which are designed to generate image data from the measuring signals of the SPM 140 and the detectors 170 and/or 175 and further measured data if applicable.

Finally, the computer system 185 can comprise a translation unit 188 which brings the SPM 140 from a parking position to an operating position by applying electrical signals. Additionally, the translation unit 188 can also be used to move the sample stage 115 in one, two or three spatial directions.

The computer system 185 can be integrated in the measuring apparatus 100 or can be formed as a separate device. The computer system 185 can be performed in hardware, software, firmware, or a combination thereof.

The diagram 200 of FIG. 2 shows an enlarged section of the measuring apparatus 100 in the region of the two measuring points 190, 195 on the sample 110 around the lower end of the SBM 120 and the SPM 140. The left side again shows the Piezo actuator 155, the cantilever 160 and the test prod 165 or the probe 165 of the SPM 140 of FIG. 1. The measuring points 190 and 195 have a distance vector $\vec{D}_1$.

The reference object 125 is fixedly connected to the lower end of the column 130 by the support 126. In the example of FIG. 2, the reference object 125 has a grid-like or a lattice-like structure 127 with openings through which the electron beam 135 can pass the lattice-like structure 127 without essentially interacting with the lattice-like structure 127. In the example represented in FIG. 2, the reference object 125 thus comprises the support 126 and the lattice-like structure 127.

Figure 3:
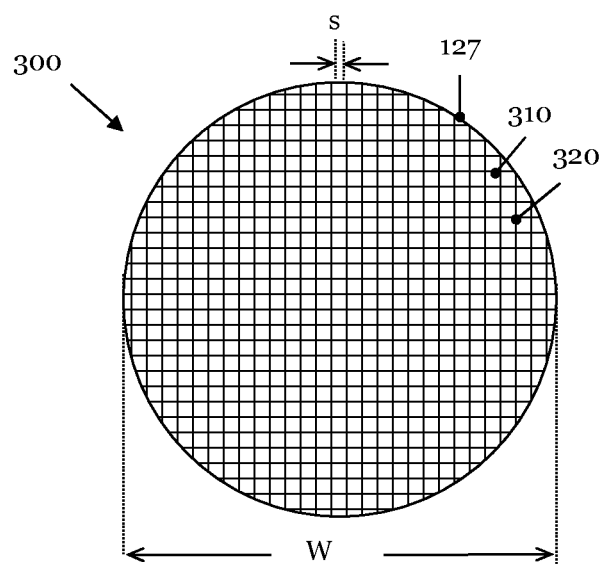
FIG. 3 represents a schematic top view of a lattice of a reference object.

The diagram 300 of FIG. 3 schematically presents a strongly enlarged top view of an example of a lattice-like structure 127 of a reference object 125. In the example represented in FIG. 3, the lattice-like structure 127 comprises a lattice 310 with square openings 320. The width of the individual openings 320 of the lattice is denominated by "s". The electron beam 135 or the particle beam 135 can, for example pass through one of the openings 320 in the center of the lattice 310 in order to reach the sample 110 which is arranged below the lattice 310 (the sample is not represented in FIG. 3).

The exemplary lattice 310 of FIG. 3 has an outer dimension "W". The outer dimension of the lattice 310 of the reference object 125 depends on the imaging properties of the SBM 120 on which the reference object 125 fixed to. Moreover, the outer dimensions of the lattice 310 or the lattice-like structure 127 as well as the reference object 125 altogether depend on the surface topography of the sample 110. In order to simultaneously sharply display a portion of the sample 110 and a portion of the lattice 310, the lattice 310 should be arranged in a distance as low as possible from the sample surface 118. By reason of this requirement, it is beneficial to adapt the size of the reference object 125, and thus the outer dimension "W" of the lattice 310 to the unevenness of the sample 110. However, it is often not necessary to arrange the reference objects 125 in a distance from the sample surface 118 as low as possible, since the beam optics is adjusted such that readjusting of the focus does essentially not influence the lateral position of the particle beam 135. For sample whose surfaces 118 are essentially flat, the outer dimension "W" of the lattice 310 can be selected so that they can be easily manufactured on the one hand, and, on the other hand, their outer dimension can be adapted to the largest possible scan region of the particle beam 135.

The outer dimension "W" of the lattice 310 and thus the outer dimension of the reference object 125 can be in the range of about 0.1 mm to about 10 mm. The distance of the lattice 310 and thus the reference object 125 from the sample surface 118 can vary within a range from about 1 mm to about 10 µm. The lattice 310 and thus the reference object 125 is round in the example of FIG. 3. This is beneficial since the beam openings of the SBMs 120 preferably have this form. However, the reference object 125 is not limited to a circular embodiment, rather it can have an arbitrarily formed outer contour, as for example a triangle, a tetragon, or generally a polygon with n edges.

Figure 4:
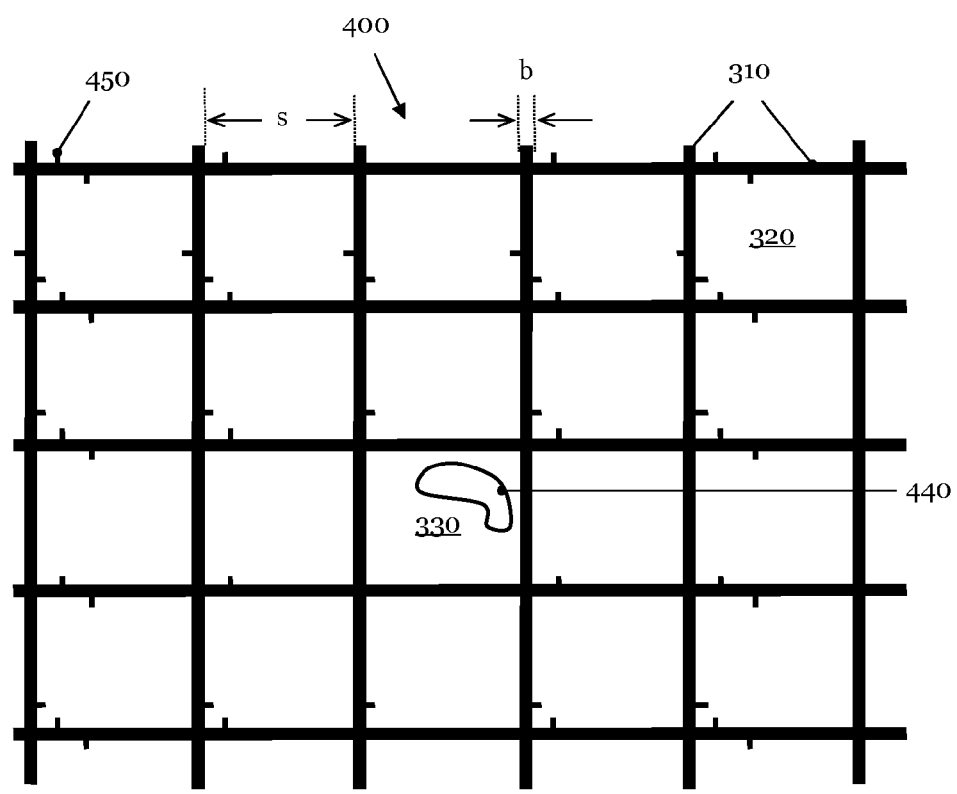
FIG. 4 depicts an enlarged section of the lattice of the reference object of FIG. 3 with a structural element on the sample surface.

FIG. 4 represents an enlarged section 400 of the lattice 310 of FIG. 3. In the section of the exemplary lattice 310 represented in FIG. 4, the square openings 320 have a width "s" which extends from about 10 µm to about 100 µm. As the consequence, the sample 110 can be scanned essentially unaffected by the lattice 310 within the lattice opening 320 by use of the electron beam 135. A typical scan region of the electron beam 135 comprises an area of approx. 1 µm×1 µm up to approximately 1 mm×1 mm. The lattice bars of the lattice have a material thickness "b" of about 0.5 µm to about 50 µm.

In the example indicated in FIG. 4, a sample 110 which is arranged below the lattice 310 has a contour 440 in a range of the central opening 330 of the lattice 310 of the reference object 125. The contour 440 can be a defect of the sample 110. The contour 440 can also be a structural element of the sample 110. In the example, where the sample 110 is a photo mask, the structural element could be an absorber structure or could be a mark arranged on the sample 110. In order that scanning the contour 440 by use of the particle beam 135 does essentially not influence the reference object 125, the particle beam 135 has to have a distance of some beam diameters from the lattice bars of the reference object 125. Since a focused electron beam 135 typically has a beam diameter in the one digit nanometer range, a distance of about 10 nm is sufficient between the electron beam 135 and the lattice bars of the reference object 125 in order to guarantee that the contour 440 can be scanned without being influenced by the reference object 125.

In the example of FIG. 4, the lattice 310 has marks 450 in order to create a coordinate system for the lattice 310. In the example represented in FIG. 4, the reference point of the coordinate system is the central opening 330 through which the electron beam 135 preferably scans the sample 110. However, it is also possible to use an arbitrary lattice opening 320 for scanning a contour 440. In the example of FIG. 4, the central lattice opening 330 does not have any mark 450. The lattice openings 320 have one or several marks 450 in the x-direction and the y-direction which uniquely identify the lattice opening 320 with respect to the central lattice opening 330. In the example represented in FIG. 4, the marks are line markings both for each column and each row wherein the line markings identify a lattice opening 320 with respect to the central lattice opening 330.

In order to be able to determine the position of the electron beam 135 with respect to the reference object 125 by use of image processing algorithms, the edges of the reference object 125 should be sharply defined so that the edges can be well identified by use of the particle beam 135. Additionally or alternatively, the contrast which the reference object 125 provides in the SBM or in the SEM (scanning electron microscope) image (e.g. by use of a material contrast) should significantly distinguish the reference object 125 from the background. Moreover, it is beneficial to select the geometry of the reference object 125 in a way so that the image processing can be kept simple, for example in that the SBM images are similar at various magnifications.

In an exemplary embodiment, the electron beam 135 scans the contour 440 of the sample 110 within the central opening 330 of the lattice 310 of the reference object 125, in order to analyze the contour 440. For example, in order to investigate the contour 440 with another resolution or with another kinetic energy of the particles of the particle beam 135, the settings of one or several parameters of the SBM 120 are changed. These changes of the settings of the SBM 120 can distort, warp, or twist the path of the particles or electrons through the beam optics 124 arranged in the column 130 of the SBM 120. As a consequence, the point of impact of the particle beam or the electron beam 135 is changed on the sample 110.

If this change of the point of impact of the electron beam 135 on the sample is not measured and not corrected, the regions of the sample 110 which are subsequently investigated by use of the SBM 120 and the SPM 140 do not or at least partially not coincide when superimposed by the evaluation unit 126 of the computer system 185. As a consequence of this the investigated sample sections are wrongly interpreted.

Figure 5:
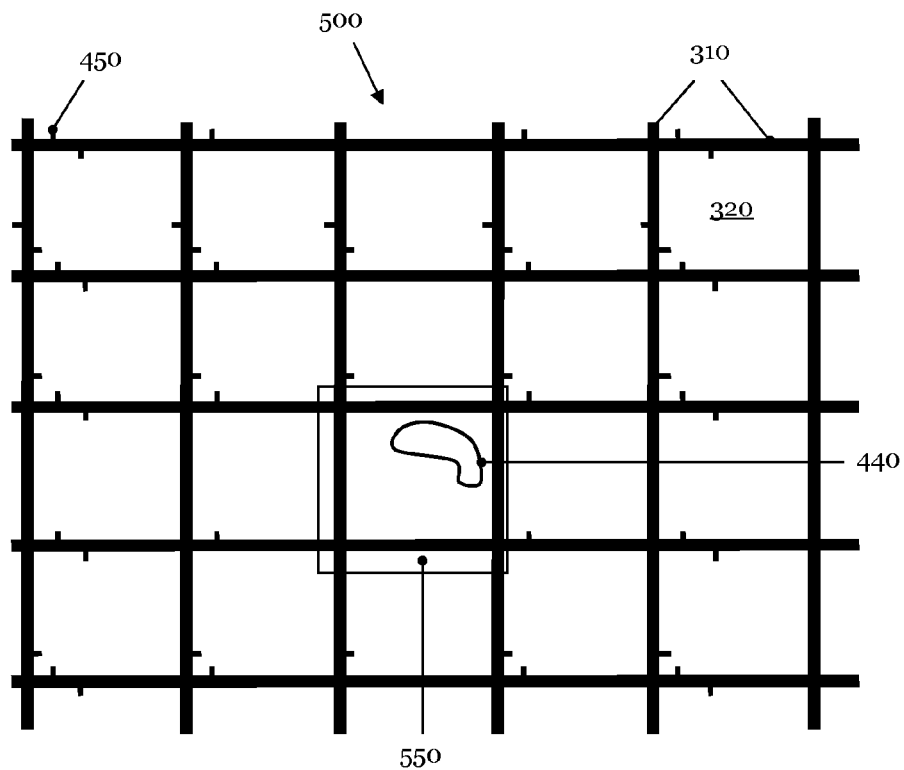
FIG. 5 schematically shows the scan region of a particle beam of the scanning particle microscope around the structural element represented in FIG. 4 prior to changing a setting of the scanning particle microscope.

Therefore, prior to changing a setting of the SBM 120 which leads to a variation of the point of impact 190 of the particle beam 135 on the surface 118 of the sample 110, the scan region of the particle beam 135 is enlarged to such an extent that the particle beam 135 at least images one, preferably the central lattice opening 330 and the lattice bars surrounding the central lattice opening 330 of the reference object 125. FIG. 5 schematically shows the scan region 550 of the particle beam 135, and thus also the field of view 550 of the SBM 120. In order that both the contour 440 of the sample 110 and the lattice bars of the lattice 310 are simultaneously sharply displayed in the SBM image which the evaluation unit 186 of the computer system 185 generates, it is preferred that the distance between the sample surface 118 and the lattice 310 is as small as possible so that both objects are within the depths of focus region of the SBM 120.

In an alternative embodiment, in a first scan, the electron beam is focused on the surface 118 of the sample 110 or its contour 440. Then, the focus is adjusted to the layer of the lattice 310 and the identical scan region 550 is again scanned. This embodiment is particularly beneficial if the sample surface 118 and the lattice 310 of the reference object 125 have a large distance (e.g. >100 μm). The scanned data of the scanning region 550 at which the lattice 310 is focused to the reference object 125 is analyzed by the evaluation unit 186 of the computer system 185 and/or is stored. In the next step, one or several changes of the settings of the SBM 120 are done. Examples of setting changes of the SBM 120 are: changing the magnification, the focus, the stigmator, the acceleration voltage, the beam shift, an aperture diaphragm and/or adjusting the position of the particle source of the SBM 120. As already explained above, this setting change(s) of the SBM 120 can distort or warp the path of the particles or electrons through the electron optics 124 arranged in the column 130 of the SBM 120. Scanning the scanning region 550 again leads to a shift of the scan region 650 relative to the reference object 125 and the contour 440 of the sample surface 118.

Figure 6:
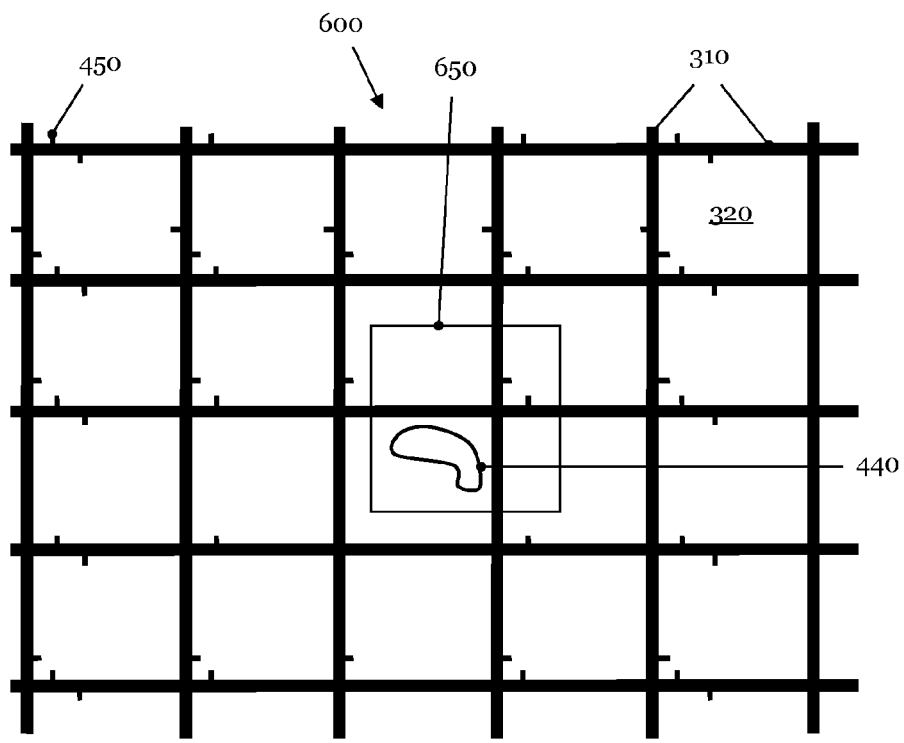
FIG. 6 schematically illustrates the shift of the scan region with respect to the structural element on the sample and the section of the lattice of FIG. 4 due to a setting change of one or several parameters of the scanning particle microscope.

FIG. 6 illustrates the shift of the scan region 650 in comparison to the scan region 550 prior to performing the setting change(s) of the SBM 120. From the data of the scans prior to (scan region 550) and after changing the settings of the SBM 120 (scan region 650) the evaluation unit 186 of the computer system 185 determines the shift of the point of impact 190 of the particle beam 135 or the electron beam 135 on the surface 118 of the sample 110.

In the previous FIGS. 3-6 the material of the lattice 310 of the reference object has not been specified, since the material can be selected arbitrarily. However, it is beneficial if the lattice 110 does not have the same material composition as the sample 110. As a consequence of this, apart from a topography contrast between the sample 110 and the lattice 310, a material contrast additionally occurs in the SBM image generated by the evaluation unit 186. This facilitates the separation of the contour 440 and the lattice bars of the lattice 310 in the SBM image.

In another embodiment, however, it is beneficial if the lattice 310 of the reference object 125 has an electrically conductive material. For example, the reference object 125 can comprise a metal or a metal alloy. An electrically conductive reference object 125 can simultaneously act as a shielding grid, which shields the electrical charges generated when scanning the contour 440 on the surface 118 of the sample 110. For this reason, an electrically conductive reference object 125 can avoid a deflection of a charged particle beam, in particular an electron beam 135 due to electrical charges available on the sample 110. Apart from the electron beam 135, incident on the sample 110, the charged particles which are generated by the electron beam 135 and which are used for generating a SEM image are also deflected by an electrical charging of the surface 118 of the sample 110 on their path from the sample surface 118 to the detectors 170 or 175. Thus, an electrically conducting reference object 125 can simultaneously counteract the corruption of the measuring results when investigating the contour 440.

Figure 7:
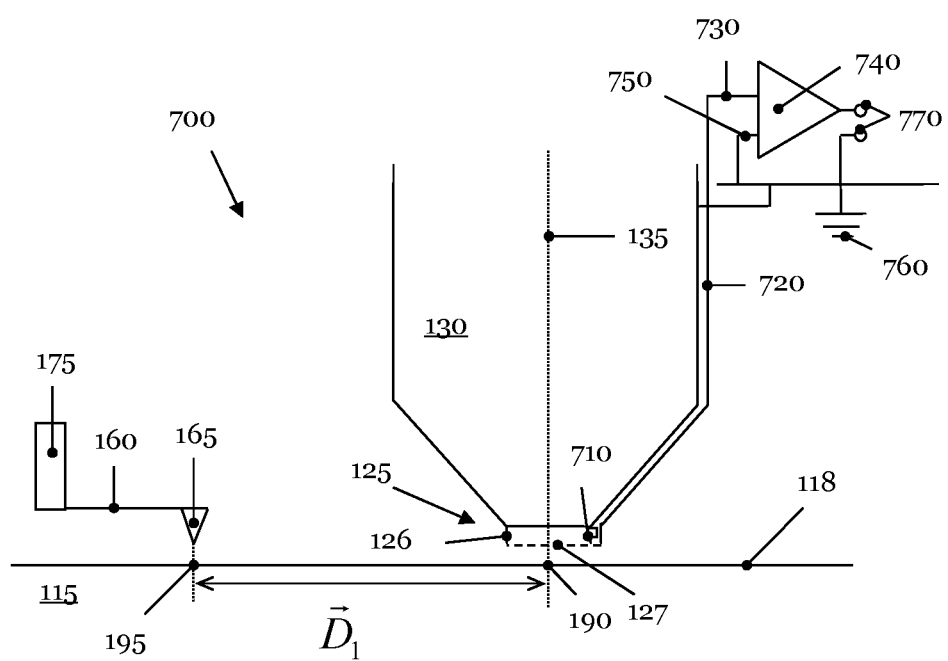
FIG. 7 represents an enlarged section of the measurement apparatus of FIG. 2, wherein one end of the reference object is electrically isolated from the scanning particle microscope and is connected with a trans-impedance amplifier.

An electrically conducting reference object 125 having a lattice-like structure 127, as for example the lattice 310 of FIG. 3, has an additional benefit. The lattice 310 can be connected to a first side of the support 126 at the output opening of the electron beam 135 of the column 130 in an electrical conductive way. A second side of the electrically conductive support 126 is fixedly connected with the output opening of the electron beam 135 via the electrical isolator 710. FIG. 7 shows this arrangement. The electrically isolated side of the lattice-like structure 127 or the lattice 310 is connected with an input 730 of an electrical amplifier 740 via an electrical connection 720. In the example indicated in FIG. 7, the electrical amplifier 740 is a trans-impedance amplifier. However, other kinds of amplifiers can also be used.

The second input 750 of the trans-impedance amplifier 740 is connected to earth 760. The column 130 of the SBM 120 is also connected to earth 760. The output 770 of the trans-impedance amplifier 740 delivers a voltage which is proportional to the current which is generated when the electron beam 135 illuminates a lattice bar of the lattice-like structure and releases electrical charges at this position. The electrical signal available at the output 770 of the trans-impedance amplifier 740 thus indicates whether the electron beam 135 currently scans across the surface 118 of the sample 110 or currently impacts on one of the lattice bars of the lattice-like structure 127. Thus, the output signal 770 of the trans-impedance amplifier 740 provides an additional channel to discriminate whether a structure available in an SEM image generated by the evaluation unit 186 comes from a contour 440 of the sample 110 or from one of the lattice bars of the lattice 310.

It is not necessary that the lattice-like structure 127 of the reference object 125 has a periodic lattice 310 with square openings 320 as represented in FIGS. 3-6. Rather, it is sufficient if the lattice-like structure 127 has one or several regularly or unregularly formed openings through which a particle beam 135 can pass essentially undisturbed in order to scan a predetermined region of the sample 110.

Figure 8:
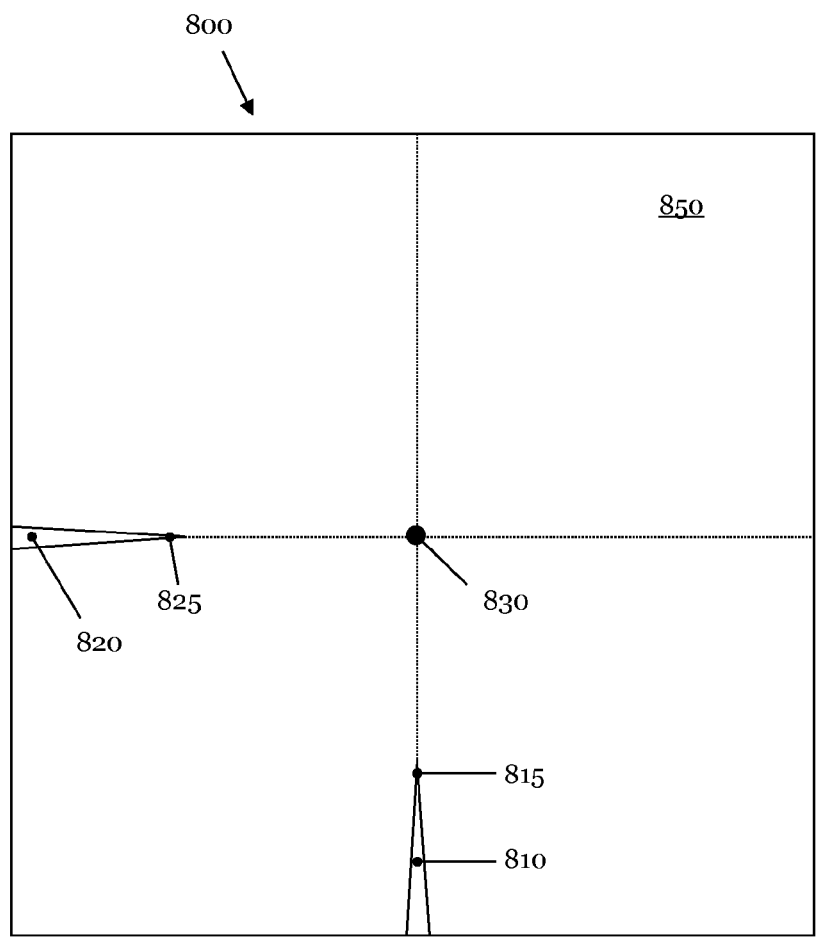
FIG. 8 schematically represents the locator structure of a pointer structure as part of the reference object in the scanning region of the particle beam of the scanning particle microscope.

FIG. 8 shows a second embodiment of a reference object 125 in form of a locator or pointer structure 800. In the exemplary locator structure 800 represented in FIG. 1, two locators 810 and 820 point in the scan region 850 of the electron beam 135 of the SBM 120. The two locators 810, 820 have the form of a spear head 815, 825. Similar to the example represented in FIG. 2, the reference object 125 of FIG. 8 comprises a support 126 (not represented in FIG. 8) and the locator structure 800. With respect to the outer dimensions of the locator structure 800, it is referred to the discussion of FIG. 3. Regarding the length of the locators 810, 820, it is necessary to find a trade-off that the length is as large as possible, on the one hand, in order to be able to detect a large shift of the scan region 850, and, on the other hand, that an area portion of the sample surface 118 which is shadowed by the locator 810, 820 is as low as possible. The width of the locator 810, 820 at the opposite end of the tip 815, 825 is in the range of the lattice bar "b" of the lattice 310 of FIG. 4. With respect to the material of the locator 810, 820 of the locator structure 800, the explanation above regarding the material properties of the lattice 310 also applies.

In the example of FIG. 8, the tips 815, 825 of the locators 810, 820 point to the center focus or the center of gravity of the scan region 850. The center of the scan region 850 is also called reference position 830. However, it is not necessary that the reference position 830 is identical with the center of gravity of the scan region 850.

For reasons of simplicity, a contour of a sample surface 118 is not indicated in FIG. 8. A reference object 125 in form of a locator structure 800 consumes only a minimum area portion of the scan region 850 and thus does not significantly disturb scanning of the sample surface 118 by the particle beam 135 of the SBM 120. Moreover, the locator structure 800 can independently be interpreted from the magnification of the SBM 120. However, if the reference object 125 has the form of a lattice 310, its periodicity could lead to an ambiguity.

After scanning the scanning region 850 and determining the reference point 830 from the data of the locators 810, 820 one or several settings of the SBM 120 are changed. Then, the scanning unit 182 again scans the area of the scan region 850 of FIG. 8. Due to a distortion of the beam optic 124, the particle beam 135 of the SBM 120 scans a scanning region 950, which is shifted with respect to the scanning region 850 of FIG. 8.

Figure 9:
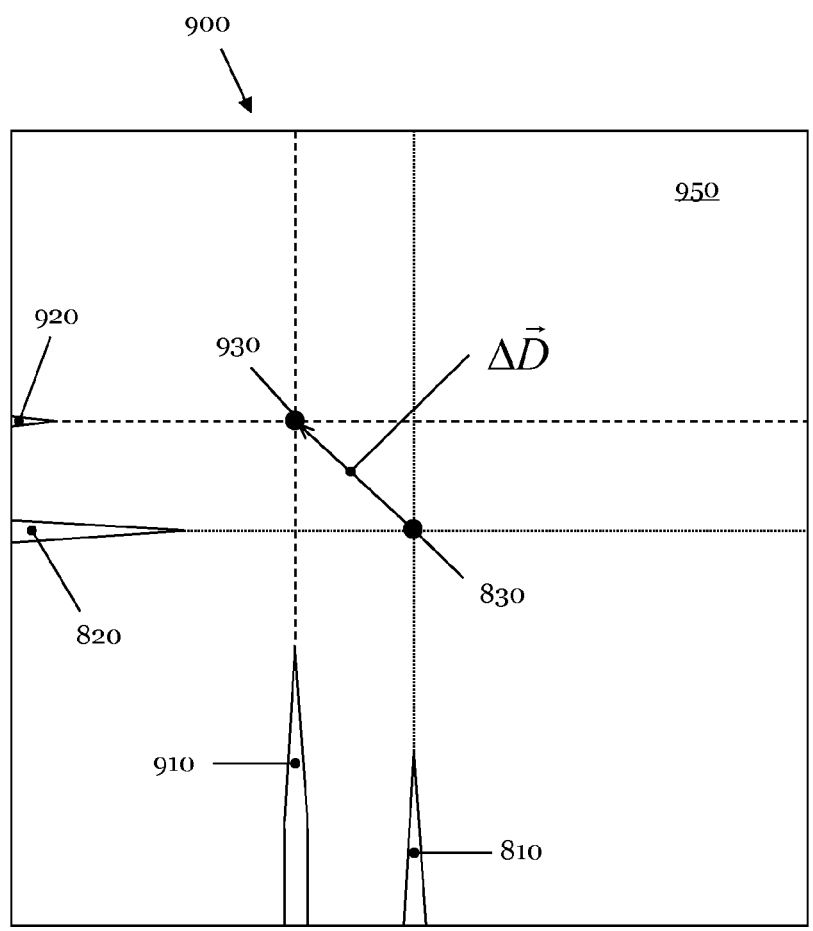
FIG. 9 schematically represents the locator or pointer structure of FIG. 8, i.e. prior to changing a setting of the scanning particle microscope and schematically shows the locator structure in the scanning region of the particle beam of the scanning particle microscope after the setting change.

FIG. 9 shows the scanning region 950 as well as the locator structure 900. The shift of the scanning region 950 leads to a variation of the locator 910 and 920 compared to the locators 810 and 820 prior to the setting change of the SBM 120. For purposes of comparison the locators 810 and 820 of the original scan region 850 are also represented in FIG. 9. The evaluation unit 186 of the computer system 185 determines from the locators 910 and 920, the reference position 930 which has a shift of $\Delta \vec{D}$ with respect to the original reference position 830.

The locator structure 800 of FIG. 8 comprises two locators 810, 820 which are arranged with an angle of 90°. However, it is also possible to arrange more than two locators so that their tips 815, 820 point to a common reference point and this reference point is located in the scanning region 850 of the particle beam (not represented in FIG. 8). Preferably, the reference point is in the center of gravity of the scan region 850. By this selection the largest detectable shift of the scan region 850 or equivalent of the reference point 830 is reached by a setting change of the SBM 120, i.e. with respect to the scan region 950. However, it is not necessary that the reference point 830 coincides with the center of gravity of the scan region 850. Rather, it is sufficient that the reference points 830 and 930 are within the scan regions 850 and 950. Further, it is also not necessary as indicated in FIG. 1 that the locators or pointers 810 and 820 are arranged at the median lines of the scan region 850. Moreover, the locators 810, 820 have not to be parallel to one of the limitations of the scan region 850. Additionally, the scan region 850 in FIG. 8 has a square form. A reference object 125 having a locator structure 850 is not restricted to the application of a scan region 850 with a square or rectangular form of the scan region 850. Rather, the reference object 125 having a locator structure 800 can be used in connection with an arbitrarily shaped scan region.

Figure 10:
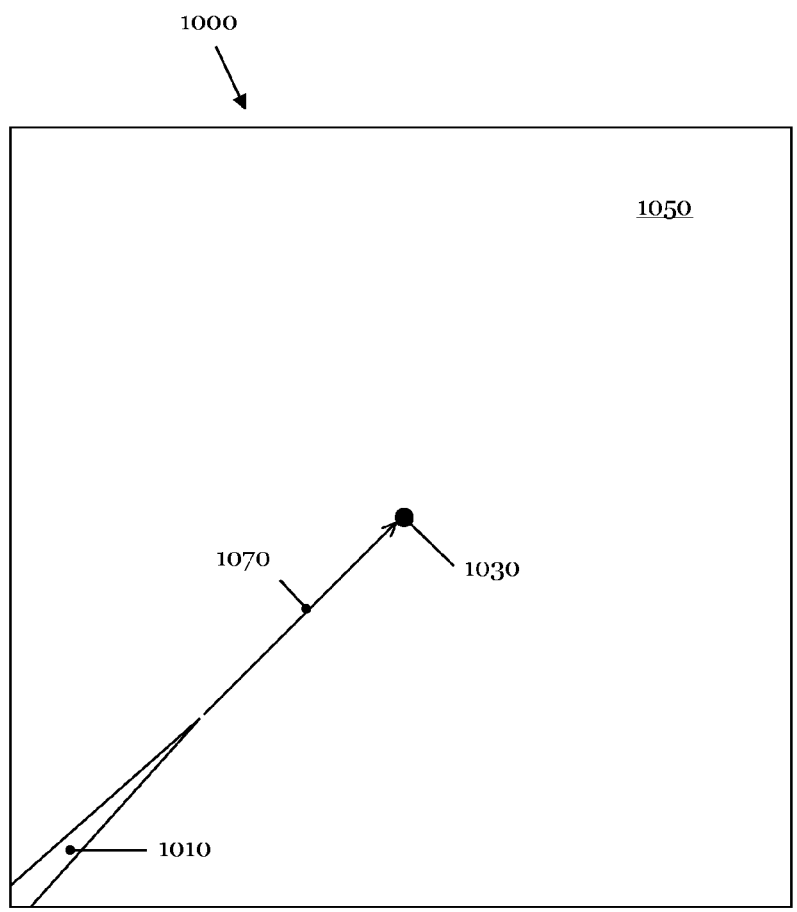
FIG. 10 schematically represents a second locator structure as part of a reference object in a scan region of the particle beam of the scanning particle microscope.

FIG. 10 shows a further embodiment of a reference object 125 which comprises a second locator structure 1000. The exemplary locator structure 1000 of FIG. 10 comprises a single locator 1010 which extends in the scan region 1050 of the particle beam 135 of the SBM 120. Similar to the examples of FIGS. 2 and 8, the reference object of FIG. 10 comprises a support 126 (not shown in FIG. 10) and a locator structure 1000. The locator 1010 diagonally points into the direction in the scan region 1050 of the particle beam 135 of the SBM 120 starting from the lower left corner. A vector 1070 describes the distance and the direction of the tip 1015 of the locator 1010 to the reference point 1030 which is again selected as the center of gravity of the scan region 1050 as in the example of FIG. 10. As explained above, the reference point 1010 can be arbitrarily selected within the scan region 1050.

Figure 11:
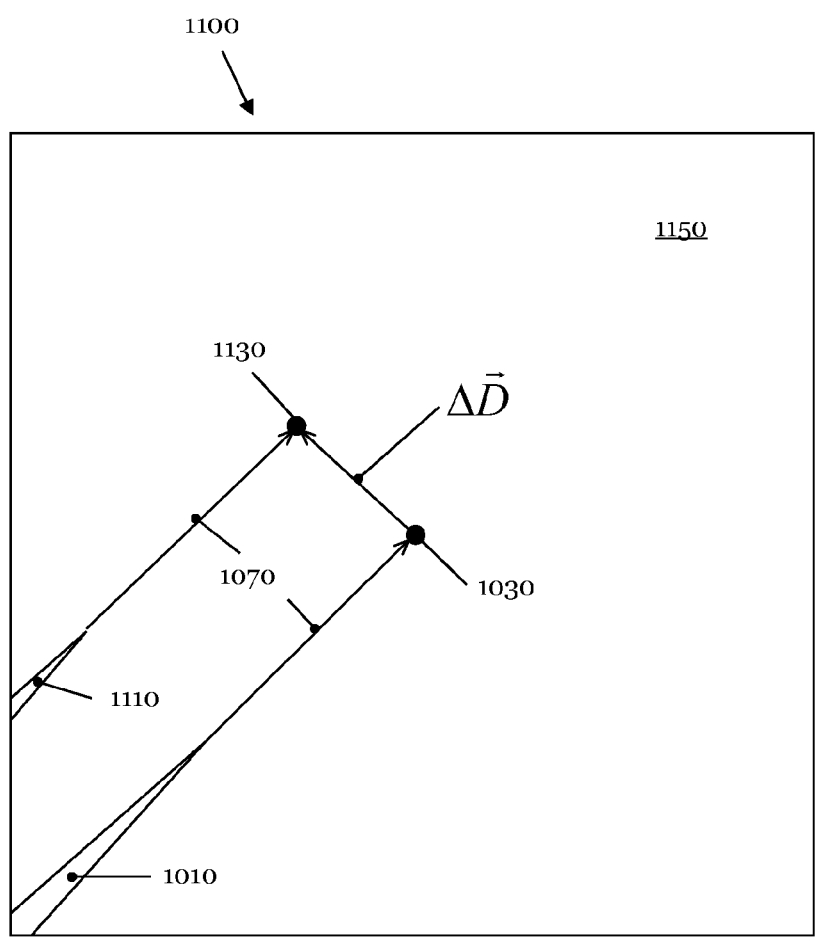
FIG. 11 schematically indicates the second locator structure of FIG. 10 prior to changing a setting of the scanning particle microscope and represents the locator structure in the scanning region of the particle beam of the scanning particle microscope after the setting change.

FIG. 11 represents the locator 1110 in the scan region 1150 of the particle beam 135 of the SBM 120 which results when scanning the region 1150 after one or several setting changes of the SBM 120. For purposes of comparison the scan region 1150 also shows the locator 1010 of FIG. 10, i.e. prior to a re-calibration of the SBM 120. Due to the shift of the scan region 1150 with respect to the scan region 1050 of FIG. 10, the locator 1110 and the vector 1070 point to a reference point 1130 which has a shift vector $\Delta \vec{D}$ with respect to the reference point 1030. Based on the data determined from the scan regions 1050 and 1150, the evaluation unit 186 of the computer system 185 can thus determine the shift $\Delta \vec{D}$ of the point of impact of the particle beam 135 on the surface 118 of the sample 110 which is caused by the setting change of the SBM 120.

Figure 12:
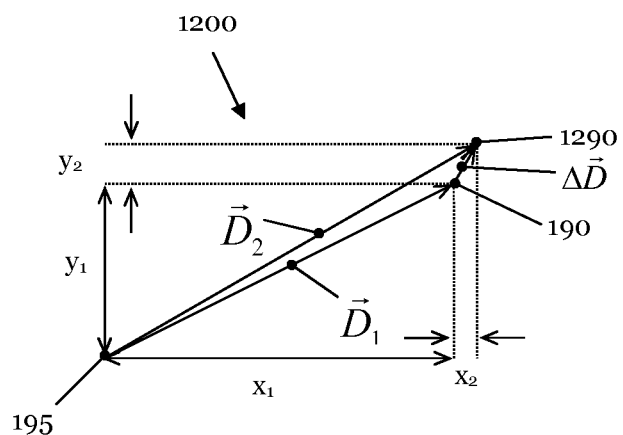
FIG. 12 schematically illustrates the change of a distance between a scanning particle microscope and a scanning probe microscope, wherein the change of the distance is caused by a setting change of the scanning particle microscope.

The diagram 1200 of FIG. 12 again summarizes an essential aspect of the present application. In the initial position, the interaction point 195 of the SPM 140 and the point of impact 190 of the particle beam 135 on the sample 110 have a distance vector $\vec{D}_1$. Caused by a new setting of the SBM 120 the point of impact of the SBM 120 shifts from the position 190 to the position 1290, i.e. by the two-dimensional vector $\Delta \vec{D}$. As explained in the introductory part, according to the prior art this results in a complex new determination of the new distance vector $\vec{D}_2$ from the interaction point 195 to the point of impact 1290. The present invention replaces the determination of the distance vector $\vec{D}_2$ by determining the vector $\Delta \vec{D}$ by the help of a reference object 125 which is arranged at the column 130 of the SBM 120 and the original distance $\vec{D}_1$ according to the relation $$\vec{D}_2 = \vec{D}_1 + \Delta \vec{D}. \quad (1)$$

As a consequence of this, the present application avoids a movement of the SBM 120, of the SPM 140, or of both analysis tools 120, 140, or of a new determination of the vector $\vec{D}_2$.

Figure 13:
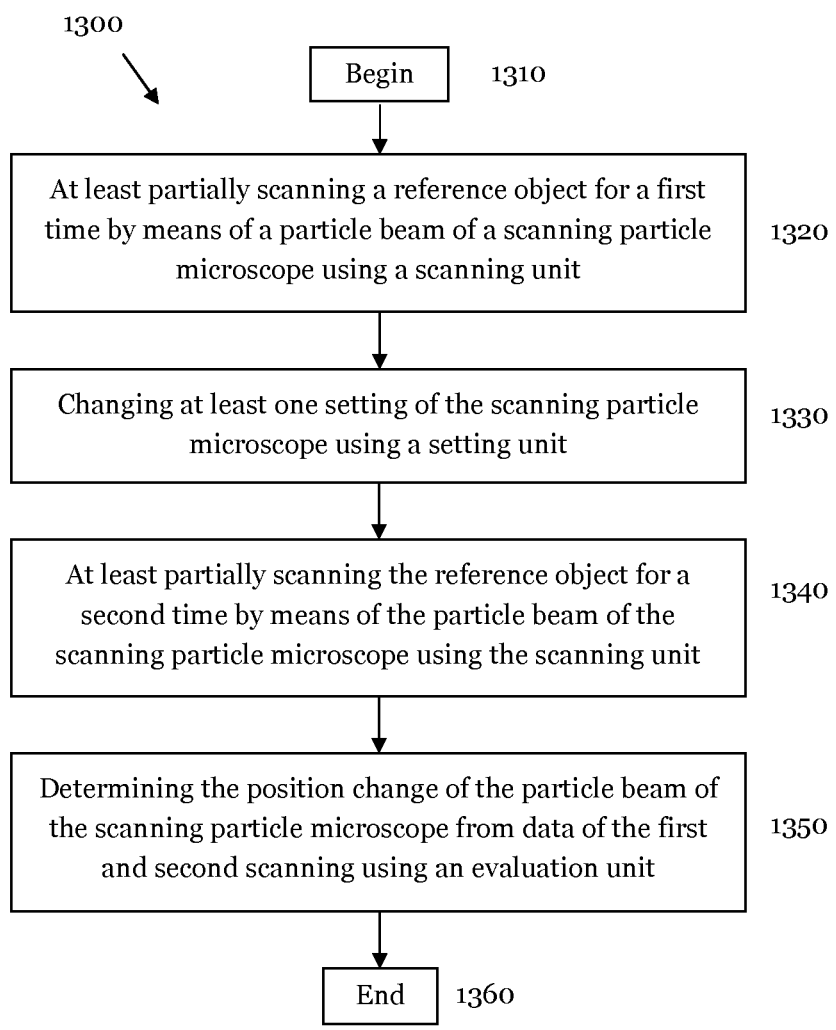
FIG. 13 represents a flow chart for the method for determining a position change of a particle beam of a scanning particle microscope.

Finally, the flow chart 1300 of FIG. 13 again summarizes the steps of the described method for determining a position change of a particle beam 135 of a scanning particle microscope 120 due to at least one setting change of the scanning particle microscope 120. The method begins at step 1310. In the next step 1320, a scanning unit 182 of a computer system 185 scans the particle beam 135 of the SBM 120 across at least a portion of a reference object 125. From this data an evaluation unit 186 determines the relative position of the reference object 125 within the scan regions 550, 850, 1050. At step 1330, a setting unit 184 of the computer system 185 changes one or several settings of the SBM 120. Then, at step 1340, the scan unit 182 again scans a particle beam 135 across a portion of the sample 110 in order to determine the position of the reference object with respect to the new scan region 650, 950, 1150. In step 1350, the evaluation unit 186 determines from the data of the first and the second scan a change of the position $\Delta \vec{D}$ of the particle beam, i.e. a change of the point of impact of the probe 110. The method ends at step 1360.

In some implementations, the computer system 185 can include one or more processors and one or more computer-readable media (e.g., RAM, ROM, SDRAM, hard disk, optical disk, and flash memory). The one or more processors can perform various calculations described above. The calculations can also be implemented using application-specific integrated circuits (ASICs). The term "computer-readable medium" refers to a medium that participates in providing instructions to a processor for execution, including without limitation, non-volatile media (e.g., optical or magnetic disks), and volatile media (e.g., memory) and transmission media. Transmission media includes, without limitation, coaxial cables, copper wire, fiber optics and free space.

The features described above can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language (e.g., C, Java), including compiled or interpreted languages, and it can be deployed in any form, including as a stand-alone program or as a module, component, subroutine, a browser-based web application, or other unit suitable for use in a computing environment.

Suitable processors for the execution of a program of instructions include, e.g., general purpose microprocessors, special purpose microprocessors, digital signal processors, single-core or multi-core processors, of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM, DVD-ROM, and Blu-ray BD-ROM disks. The processor and the memory can be supplemented by, or incorporated in, ASICs (application-specific integrated circuits).

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments.

Thus, particular embodiments of the subject matter have been described. Other embodiments are within the scope of the following claims. In some cases, the actions recited in the claims can be performed in a different order and still achieve desirable results.

What is claimed is:

1. A scanning particle microscope comprising:
    a. at least one reference object which is fixedly arranged at an output of the scanning particle microscope for a particle beam so that the reference object can at least partially be imaged by the particle beam;
    b. at least one scanning unit operable to scan the particle beam of the scanning particle microscope across at least one portion of the reference object; and
    c. at least one setting unit operable to change at least one setting of the scanning particle microscope.

2. The scanning particle microscope according to claim 1, wherein the at least one scanning unit is further operable to scan the particle beam of the scanning particle microscope across at least one portion of the reference object prior to and after at least one setting change of the scanning particle microscope by the setting unit, and wherein the scanning particle microscope further comprises an evaluation unit operable to detect the position of a point of impact of the particle beam on a sample surface relative to the reference object based on data obtained during the scanning prior to and after the setting change.

3. The scanning particle microscope according to claim 1, wherein the reference object comprises a lattice-like structure and/or a locator structure.

4. The scanning particle microscope according to claim 3, wherein the lattice-like structure of the reference object comprises openings having a width of ≤100 μm, preferred ≤50 μm, more preferred ≤30 μm, and most preferred ≤10 μm.

5. The scanning particle microscope according to claim 3, wherein the lattice-like structure and/or the locator structure of the reference object has an outer dimension ≥0.1 mm, preferred ≥0.3 mm, more preferred ≥1.0 mm, and most preferred ≥5.0 mm.

6. The scanning particle microscope according to claim 3, wherein a lattice bar of the lattice-like structure and/or a locator of the locator structure of the reference object has a width of ≤5 μm, preferred ≤2 μm, more preferred ≤1 μm, and most preferred ≤0.5 μm.

7. The scanning particle microscope according to claim 3, wherein a distance of the lattice-like structure and/or of the locator structure of the reference object from the sample surface is ≤250 µm, preferred ≤100 µm, more preferred ≤50 µm, and most preferred ≤10 µm.

8. The scanning particle microscope according to claim 3, wherein the lattice-like structure is electrically conductive for compensating surface charges on the sample surface.

9. The scanning particle microscope according to claim 8, wherein one end of the reference object is arranged on the scanning particle microscope in an electrically isolating way.

10. The scanning particle microscope according to claim 9, wherein the reference object comprises an amplifier, in particular a trans-impedance amplifier, which is spatially separated arranged from the reference object and wherein the amplifier is connected with the reference object in an electrically conductive way.

11. The scanning particle microscope according to claim 1, wherein the reference object has marks by which data measured during scanning can be assigned to a partial area of the area of the reference object.

12. The scanning particle microscope according to claim 3, wherein the locator structure comprises at least one locator in form of a spear head, and/or wherein the locator structure comprises at least two locators, which are arranged so that the spear heads point to the center of a circle and the center of the circle is within a scanning region of the scanning unit.

13. The scanning particle microscope according to claim 2, wherein the setting unit sets the scanning particle microscope so that the particle beam simultaneously images at least one portion of the reference object and at least one object available on the sample surface.

14. The scanning particle microscope according to claim 1, wherein the setting of the scanning particle microscope comprises: setting of a magnification, setting of a focus, setting of a stigmator, setting of an acceleration voltage, setting of a beam shift, adjusting a position of a particle source of the scanning particle microscope and/or changing of an aperture diaphragm.

15. A measuring apparatus with a scanning particle microscope according to claim 1 and a scanning probe microscope, wherein the measuring apparatus is operable to take into account a position change caused by a setting change of the scanning particle microscope when determining a distance between a point of impact of the particle beam of the scanning particle microscope on a sample surface and an interaction point of a probe of the scanning probe microscope with the sample surface.

16. The measuring apparatus according to claim 15, wherein a change of the distance between the point of impact and the interaction point is determined from the distance of the point of impact and the interaction point prior to the setting change of the scanning particle microscope and a vector of the change of position of the point of impact due to a setting change of the scanning particle microscope.

17. A method for determining at least one change of position of a particle beam of a scanning particle microscope due to at least one setting change of the scanning particle microscope, wherein the method comprises the following steps:

a. at least partial scanning of a reference object for a first time by use of the particle beam of the scanning particle microscope using a scanning unit, wherein the reference object is fixedly arranged at an output of the scanning particle microscope for a particle beam;

b. changing at least one setting of the scanning particle microscope using a setting unit;

c. at least partial scanning of the reference object for a second time by use of the particle beam of the scanning particle microscope using the scanning unit; and d. determining the change of position of the particle beam of the scanning particle microscope from data of the first and second scanning using an evaluation unit.

18. The method according to claim 17, wherein determining the change of position of the particle beam comprises: determining a relative shift of the reference object with respect to a scan region of the scanning unit.

19. The method according to claim 17, further comprising: measuring an electrical current generated by the reference object during scanning.

20. The method according to claim 17 further comprising:

determining a change of distance between a point of impact of the scanning particle microscope on the sample surface and an interaction point of a probe of a scanning probe microscope on the sample surface from a distance of the point of interaction and the interaction point prior to changing at least one setting of the scanning particle microscope and a vector of the change of position of the point of impact due to the setting change of the scanning particle microscope.

* * * * *